(12) United States Patent
Park et al.

(10) Patent No.: US 12,527,085 B2
(45) Date of Patent: Jan. 13, 2026

(54) DISPLAY DEVICE

(71) Applicants: Samsung Display Co., Ltd., Yongin-Si (KR); Industry-University Cooperation Foundation Hanyang University ERICA Campus, Ansan-si (KR)

(72) Inventors: Joon Seok Park, Yongin-si (KR); Saeroonter Oh, Seoul (KR); Myounghwa Kim, Seoul (KR); Su Hyun Kim, Seongnam-si (KR); Young Joon Choi, Busan (KR); Jun Hyung Lim, Seoul (KR)

(73) Assignees: Samsung Display Co., Ltd., Yongin-si (KR); Industry-University Cooperation Foundation Hanyang University ERICA Campus, Ansan-si (KR)

( * ) Notice: Subject to any disclaimer, the term of this patent is extended or adjusted under 35 U.S.C. 154(b) by 72 days.

(21) Appl. No.: 17/206,189

(22) Filed: Mar. 19, 2021

(65) Prior Publication Data

US 2022/0005837 A1    Jan. 6, 2022

(30) Foreign Application Priority Data

Jul. 2, 2020    (KR) .................. 10-2020-0081468

(51) Int. Cl.
    *H10D 86/60*    (2025.01)
    *H10D 86/40*    (2025.01)
    *H10D 86/01*    (2025.01)

(52) U.S. Cl.
    CPC .......... *H10D 86/60* (2025.01); *H10D 86/411* (2025.01); *H10D 86/431* (2025.01); *H10D 86/441* (2025.01); *H10D 86/0231* (2025.01)

(58) Field of Classification Search
    CPC ............ H01L 27/1218; H01L 27/1237; H01L 27/124; H01L 27/1288
    (Continued)

(56) References Cited

U.S. PATENT DOCUMENTS

| 4,222,062 A | * | 9/1980 | Trotter | H01L 27/10876 |
| | | | | 257/E21.655 |
| 7,858,985 B2 | * | 12/2010 | Kato | H10D 30/6715 |
| | | | | 257/66 |

(Continued)

FOREIGN PATENT DOCUMENTS

| CN | 106409767 A | 2/2017 |
| JP | 5933300 B2 | 6/2016 |

(Continued)

OTHER PUBLICATIONS

H. Ou, K. Wang, J. Chen, A. Nathan, S.Z. Deng, and N.S. Xu, "Dual-gate photosensitive FIN-TFT with high photoconductive gain and near-UV to Near-IT Responsivity", IEDM16, pp. 814-817, P.R. China, United Kingtom, 2016 IEEE International Electron Devices Meeting (IEDM), © 2016 IEEE.

(Continued)

*Primary Examiner* — Ori Nadav
(74) *Attorney, Agent, or Firm* — Innovation Counsel LLP

(57) ABSTRACT

A display device may include a substrate, a barrier layer disposed on the substrate and having a trench, an active pattern disposed on the barrier layer, formed of an oxide semiconductor, and including a channel region protruding downward along a profile of the trench, and a source region and a drain region disposed at each end of the channel region, respectively, a gate electrode disposed on the active pattern and overlapping the channel region, a source electrode disposed on the gate electrode and electrically connected to the source region, and a drain electrode disposed (Continued)

on the gate electrode and electrically connected to the drain region.

9 Claims, 8 Drawing Sheets

(58) Field of Classification Search
USPC .......................................................... 257/79
See application file for complete search history.

(56) References Cited

U.S. PATENT DOCUMENTS

| | | | |
|---|---|---|---|
| 8,766,255 B2 | 7/2014 | Isobe et al. | |
| 9,048,130 B2 | 6/2015 | Yamazaki et al. | |
| 2002/0167047 A1* | 11/2002 | Yasuhara | H01L 29/4175 |
| | | | 257/E29.054 |
| 2008/0017920 A1* | 1/2008 | Sapp | H01L 29/7803 |
| | | | 438/237 |
| 2012/0187475 A1* | 7/2012 | Yamazaki | H01L 28/40 |
| | | | 257/330 |
| 2012/0270375 A1 | 10/2012 | Sasagawa et al. | |
| 2015/0303221 A1* | 10/2015 | Ning | H01L 29/7869 |
| | | | 257/72 |
| 2017/0033106 A1 | 2/2017 | Walke et al. | |
| 2018/0182831 A1 | 6/2018 | Ahmed et al. | |
| 2018/0323264 A1 | 11/2018 | Le et al. | |
| 2019/0067409 A1* | 2/2019 | Shin | H10D 89/811 |
| 2020/0098753 A1 | 3/2020 | Dewey et al. | |
| 2020/0144345 A1 | 5/2020 | Cha et al. | |
| 2021/0057585 A1 | 2/2021 | Yan et al. | |

FOREIGN PATENT DOCUMENTS

| | | |
|---|---|---|
| KR | 10-1985645 B1 | 9/2019 |
| KR | 10-2020-0051901 A | 5/2020 |
| WO | 2019213859 A1 | 11/2019 |

OTHER PUBLICATIONS

Hai Ou, Shaozhi Deng, Ningsheng Xu, Jun Chen, and Kai Wang, "Three-dimensional fin-shaped dual-gate photosensitive a-Si TFT", P.R. China, p. 12, 978-1-5090-2687-6/16/$31.00 © 2016 IEEE.

* cited by examiner

DISPLAY DEVICE

CROSS-REFERENCE TO RELATED APPLICATION

This application claims priority under 35 USC § 119 to Korean Patent Application No. 10-2020-0081468 filed on Jul. 2, 2020 in the Korean Intellectual Property Office (KIPO), the entire disclosure of which is incorporated herein by reference.

BACKGROUND

1. Field

The present disclosure relates to a display device. More particularly, the present disclosure relates to a display device including a plurality of transistors having improved electrical characteristics.

2. Description of the Related Art

The importance of a display device has been increasing with a development of multimedia. Accordingly, various types of display devices, such as liquid crystal displays (LCD) and organic light emitting displays (OLED), are widely used in different types of electronic devices including portable devices such as a smart phone, a smart watch, or smart pad. Generally, a display device may include pixels and a driver for driving the pixels. Each of the pixels and the driver may include a plurality of transistors.

As the resolution of the display device increases and a dead space of the display device decreases, an area in which the transistors are disposed may decrease. Accordingly, electrical characteristics of the transistors disposed in a relatively small area may deteriorate. Therefore, there is need to develop a novel display device with a plurality of transistors which do not deteriorate electrical characteristics.

SUMMARY

Embodiments provide a display device including a plurality of transistors having improved electrical characteristics.

A display device according to an embodiment may include a substrate, a barrier layer disposed on the substrate and having a trench, an active pattern disposed on the barrier layer, formed of an oxide semiconductor, and including a channel region protruding downward along a profile of the trench, and a source region and a drain region disposed at both ends of the channel region, respectively, a gate electrode disposed on the active pattern and overlapping the channel region, a source electrode disposed on the gate electrode and electrically connected to the source region, and a drain electrode disposed on the gate electrode and electrically connected to the drain region.

In an embodiment, the display device may further include a buffer layer disposed between the barrier layer and the active pattern and formed along the profile of the trench.

In an embodiment, the display device may further include a lower conductive pattern disposed between the barrier layer and the buffer layer, formed along the profile of the trench, and having a uniform thickness.

In an embodiment, the lower conductive pattern may be electrically connected to the gate electrode or the source electrode.

In an embodiment, the lower conductive pattern may have a thickness of 100 nm or less.

In an embodiment, the display device may further include an etch stop layer disposed between the substrate and the barrier layer and having an etch rate lower than an etch rate of the barrier layer.

In an embodiment, the etch stop layer may include at least one of silicon nitride, silicon oxide, and silicon oxynitride.

In an embodiment, the etch stop layer may include at least one of indium (In), gallium (Ga), zinc (Zn), tin (Sn), hafnium (Hf), titanium (Ti), and zirconium (Zr).

In an embodiment, the display device may further include a gate insulating pattern disposed between the active pattern and the gate electrode, overlapping the channel region, and formed along a profile of the channel region.

In an embodiment, the barrier layer may include at least one of silicon nitride, silicon oxide, and silicon oxynitride.

A display device according to an embodiment may include a substrate, a barrier layer disposed on the substrate and having a pattern with a pillar shape, an active pattern disposed on the barrier layer, formed of an oxide semiconductor, and including a channel region protruding upward along a profile of the pattern, and a source region and a drain region disposed at both ends of the channel region, respectively, a gate electrode disposed on the active pattern and overlapping the channel region, a source electrode disposed on the gate electrode and electrically connected to the source region, and a drain electrode disposed on the gate electrode and electrically connected to the drain region.

In an embodiment, the display device may further include a buffer layer disposed between the barrier layer and the active pattern and formed along the profile of the pattern.

In an embodiment, the display device may further include a lower conductive pattern disposed between the barrier layer and the buffer layer, formed along the profile of the pattern, and having a uniform thickness.

In an embodiment, the lower conductive pattern may be electrically connected to the gate electrode or the source electrode.

In an embodiment, the lower conductive pattern may have a thickness of 100 nm or less.

In an embodiment, the display device may further include an etch stop layer disposed between the substrate and the barrier layer and having an etch rate lower than an etch rate of the barrier layer.

In an embodiment, the etch stop layer may include at least one of silicon nitride, silicon oxide, and silicon oxynitride.

In an embodiment, the etch stop layer may include at least one of indium (In), gallium (Ga), zinc (Zn), tin (Sn), hafnium (Hf), titanium (Ti), and zirconium (Zr).

In an embodiment, the display device may further include a gate insulating pattern disposed between the active pattern and the gate electrode, overlapping the channel region, and formed along a profile of the channel region.

In an embodiment, the barrier layer may include at least one of silicon nitride, silicon oxide, and silicon oxynitride.

In the display device according to the embodiments, the active pattern may include the channel region protruding downward along the profile of the trench of the barrier layer or protruding upward along the profile of the pattern with the pillar shape of the barrier layer, so that the active pattern may include the channel region having a relatively large length in a narrow area. Accordingly, high resolution of the display device may be realized, and electrical characteristics of the transistors may be improved.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

Hereinafter, display devices in accordance with embodiments will be explained in detail with reference to the accompanying drawings.

Figure 1:
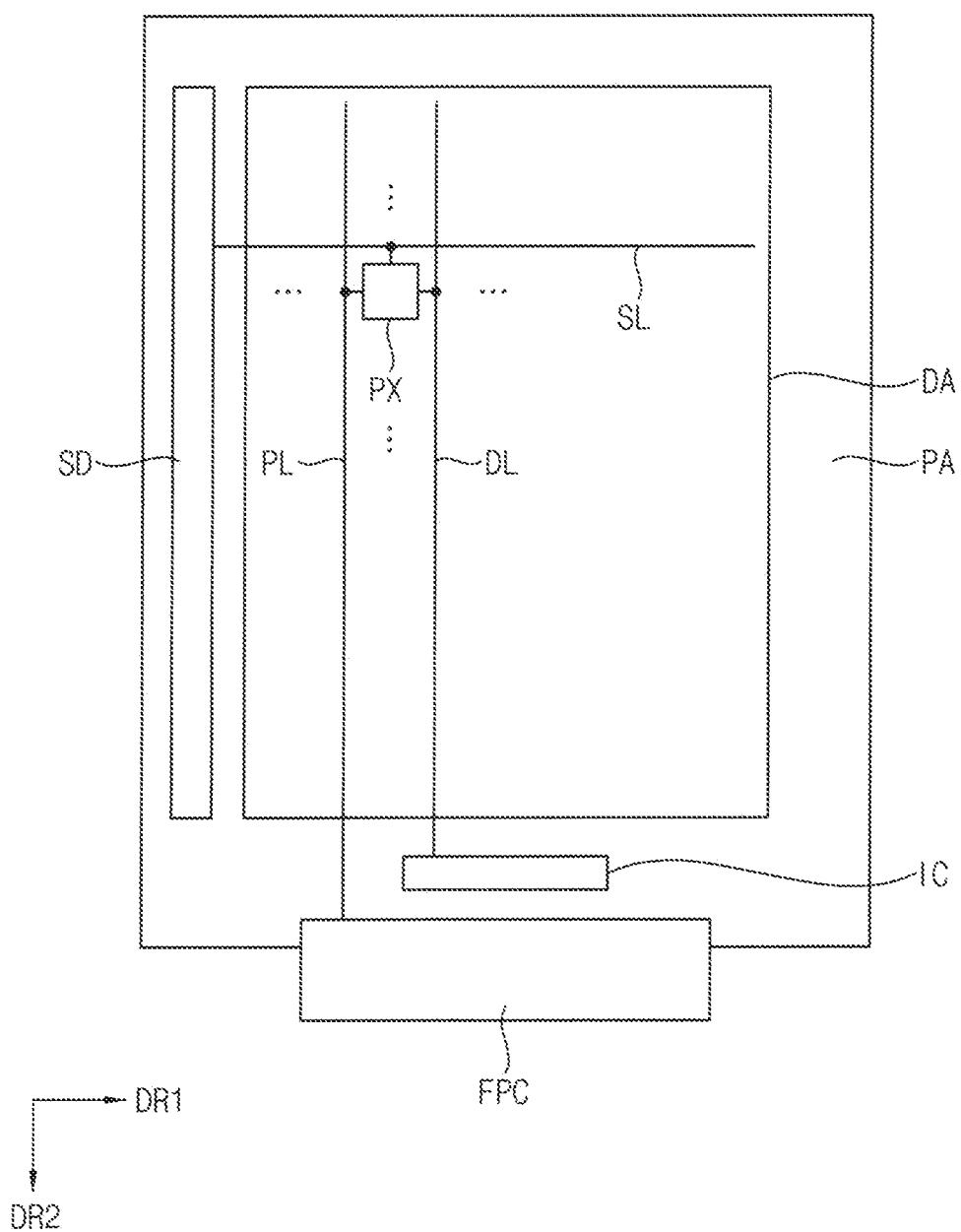
FIG. 1 is a plan view illustrating a display device according to an embodiment of the present disclosure.

FIG. 1 is a plan view illustrating a display device according to an embodiment of the present disclosure.

Referring to FIG. 1, the display device may include pixels PX disposed in a display area DA, a scan driver SD disposed in a peripheral area PA, a driving chip IC, and a flexible printed circuit FPC.

The pixels PX may be arranged in the display area DA in a first direction DR1 and a second direction DR2 crossing the first direction DR1. Each pixel PX may be connected to a scan line SL, a data line DL, and a driving voltage line PL. The scan line SL may extend in the first direction DR1 to provide a scan signal to the pixel PX. The data line DL may extend in the second direction DR2 to provide a data voltage to the pixel PX. The driving voltage line PL may extend parallel to the data line DL to provide a driving voltage to the pixel PX. The display area DA may display an image through light emitted from each of the pixels PX.

The peripheral area PA may be adjacent to the display area DA. In an embodiment, the peripheral area PA may surround the display area DA.

The scan driver SD may be disposed at a first side of the display area DA and may be connected to the scan line SL. The scan driver SD may provide the scan signal to the pixel PX through the scan line SL. The scan driver SD may include a plurality of transistors.

The driving chip IC may be disposed at a second side of the display area DA and may be connected to the data line DL. The driving chip IC may include a data driver for generating the data voltage. The data driver may provide the data voltage to the pixel PX through the data line DL.

The flexible printed circuit FPC may be disposed at the second side of the display area DA with the driving chip IC interposed therebetween, and may be connected to the driving voltage line PL. The flexible printed circuit (FPC) may include a power supply that generates the driving voltage. The power supply may provide the driving voltage to the pixel PX through the driving voltage line PL.

Figure 2:
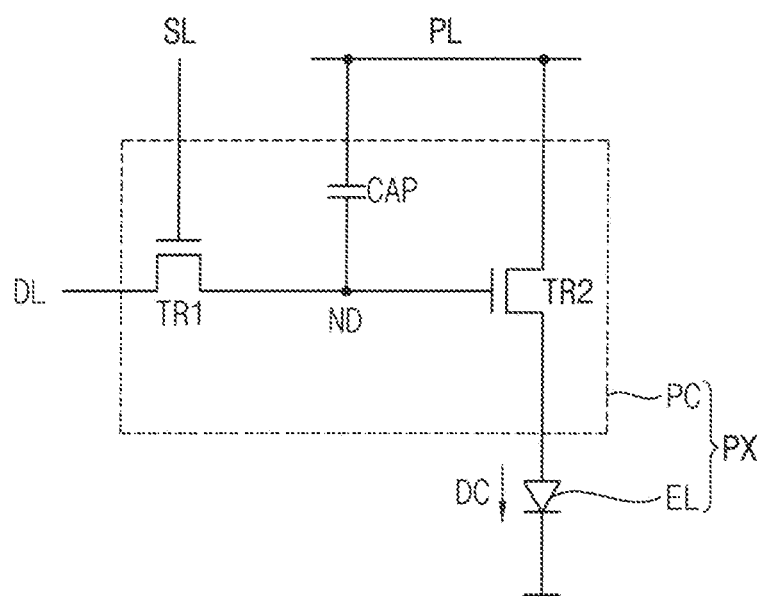
FIG. 2 is a circuit diagram illustrating a pixel PX of the display device shown in FIG. 1.

FIG. 2 is a circuit diagram illustrating a pixel PX of the display device shown in FIG. 1.

Referring to FIG. 2, the pixel PX may include a pixel circuit PC and a light emitting element EL connected to the pixel circuit PC. In an embodiment, the pixel circuit PC may include a first transistor TR1, a second transistor TR2, and a capacitor CAP. However, the present disclosure is not limited thereto, and the pixel circuit PC may include three or more transistors and/or two or more capacitors in other embodiments.

The first transistor TR1 may be connected between the data line DL and the node ND. The first transistor TR1 may include a first drain electrode configured to receive the data voltage from the data line DL, a first source electrode connected to the node ND, and a first gate electrode configured to receive the scan signal from the scan line SL. The first transistor TR1 may transmit the data voltage to the node ND based on the scan signal.

The second transistor TR2 may be connected between the driving voltage line PL and the light emitting element EL. The second transistor TR2 may include a second drain electrode configured to receive the driving voltage from the driving voltage line PL, a second source electrode connected to the light emitting element EL, and a second gate electrode connected to the node ND. The second transistor TR2 may provide a driving current DC to the light emitting element EL based on a voltage between the second drain electrode and the second gate electrode.

The capacitor CAP may be connected between the driving voltage line PL and the node ND. The capacitor CAP may include a first electrode configured to receive the driving voltage from the driving voltage line PL and a second electrode connected to the node ND. The capacitor CAP may maintain a voltage between the second drain electrode and the second gate electrode even when the first transistor TR1 is turned off.

The light emitting device EL may be connected between the second transistor TR2 and a common power source. The light emitting element EL may include a first electrode connected to the second transistor TR2 and a second electrode configured to receive a common voltage from the common power source. The light emitting device EL may emit light based on the driving current DC provided from the second transistor TR2.

Figure 3:
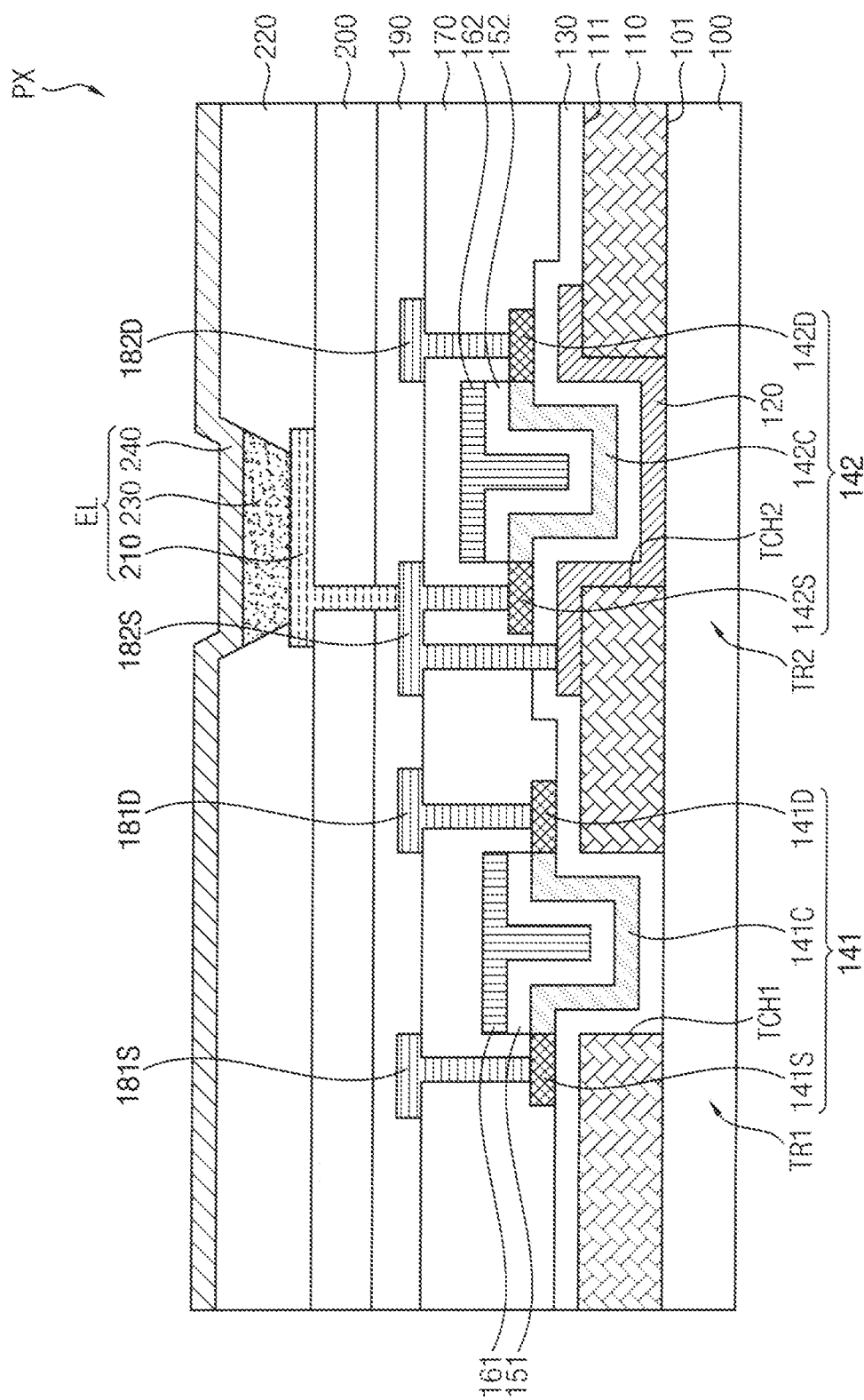
FIG. 3 is a sectional view illustrating the pixel PX of FIG. 2.

FIG. 3 is a sectional view illustrating the pixel PX of FIG. 2.

Referring to FIG. 3, the pixel PX may include the first transistor TR1, the second transistor TR2, and the light emitting element EL disposed on a substrate 100.

The substrate 100 may be a transparent insulating substrate. For example, the substrate 100 may be formed of glass, quartz, plastic, or the like.

A barrier layer 110 may be disposed on the substrate 100. The barrier layer 110 may block impurities and the like from flowing through the substrate 100. The barrier layer 110 may be formed of an inorganic insulating material such as silicon nitride, silicon oxide, or silicon oxynitride.

The barrier layer 110 may have a first trench TCH1 and a second trench TCH2. The first trench TCH1 and the second trench TCH2 may be spaced apart from each other. Each of the first trench TCH1 and the second trench TCH2 may be formed toward the substrate 100 from an upper surface 111 of the barrier layer 110. In an embodiment, each of the first trench TCH1 and the second trench TCH2 may be formed through the barrier layer 110 in the thickness direction (the third direction, DR3) to expose an upper surface 101 of the substrate 100.

A lower conductive pattern 120 may be disposed on the barrier layer 110. The lower conductive pattern 120 may block external light or impurities from flowing into the second transistor TR2 through the substrate 100. The lower conductive pattern 120 may be formed of a conductive material such as molybdenum (Mo), copper (Cu), aluminum (Al), or titanium (Ti).

The lower conductive pattern 120 may be formed along the profile of the second trench TCH2. The lower conductive pattern 120 may come into contact with the upper surface 111 of the barrier layer 110, a sidewall of the second trench TCH2, and the upper surface 101 of the substrate 100 respectively. Accordingly, the lower conductive pattern 120 may protrude downward along the profile of the second trench TCH2.

The lower conductive pattern 120 may have a uniform thickness. In an embodiment, the thickness of the lower conductive pattern 120 may be about 100 nm or less. When the thickness of the lower conductive pattern 120 is greater than about 100 nm, the lower conductive pattern 120 may not have a uniform thickness because the second trench TCH2 is fully filled with the lower conductive pattern 120.

A buffer layer 130 may be disposed on the lower conductive pattern 120. The buffer layer 130 may be disposed on the barrier layer 110 while covering the lower conductive pattern 120. The buffer layer 130 may block impurities from flowing through the substrate 100. The buffer layer 130 may be formed of an inorganic insulating material such as silicon nitride, silicon oxide, or silicon oxynitride.

The buffer layer 130 may be formed along the profile of the first trench TCH1 and the profile of the lower conductive pattern 120. The buffer layer 130 may come into contact with the upper surface 111 of the barrier layer 110, the sidewall of the first trench TCH1, the upper surface 101 of the substrate 100, and an upper surface of the lower conductive pattern 120 respectively. Since the lower conductive pattern 120 is formed along the profile of the second trench TCH2, the buffer layer 130 may be formed along the profile of the second trench TCH2.

A first active pattern 141 and a second active pattern 142 may be disposed on the buffer layer 130. The first active pattern 141 and the second active pattern 142 may be spaced apart from each other. The first active pattern 141 and the second active pattern 142 may be formed of an oxide semiconductor. The oxide semiconductor may include at least one oxide of indium (In), gallium (Ga), zinc (Zn), tin (Sn), titanium (Ti), zirconium (Zr), and hafnium (Hf).

The first active pattern 141 may include a first channel region 141C overlapping the first trench TCH1, and a first source region 141S and a first drain region 141D which are disposed at both ends of the first channel region 141C, respectively. The first source region 141S and the first drain region 141D may be doped with P-type or N-type impurities, and the first channel region 141C may be doped with other types of impurities different from the type of impurities doped in the first source region 141S and the first drain region 141D. In an embodiment, the first source region 141S and the first drain region 141D may be doped with N-type impurities, and the first channel region 141C may be doped with P-type impurities.

The first channel region 141C may protrude downward along the profile of the first trench TCH1. In other words, the first channel region 141C may protrude toward the substrate 100 along the profile of the first trench TCH1. Since the first channel region 141C protrudes downward along the profile of the first trench TCH1, the first transistor TR1 including the first channel region 141C having a relatively large length may be formed in a narrow area.

The second active pattern 142 may include a second channel region 142C overlapping the second trench TCH2, and a second source region 142S and a second drain region 142D which are disposed at both ends of the second channel region 142C, respectively. The second source region 142S and the second drain region 142D may be doped with P-type or N-type impurities, and the second channel region 142C may be doped with other types of impurities different from the type of impurities doped in the second source region 142S and the second drain region 142D. In an embodiment, the second source region 142S and the second drain region 142D may be doped with N-type impurities, and the second channel region 142C may be doped with P-type impurities.

The second channel region 142C may protrude downward along the profile of the second trench TCH2. In other words, the second channel region 142C may protrude toward the substrate 100 along the profile of the second trench TCH2. Since the second channel region 142C protrudes downward along the profile of the second trench TCH2, the second transistor TR2 including the second channel region 142C having a relatively large length may be formed in a narrow area.

The first active pattern 141 and the second active pattern 142 may have a uniform thickness. In an embodiment, in order to form the first active pattern 141 and the second active pattern 142 with a uniform thickness, the first active pattern 141 and the second active pattern 142 may be formed through an atomic layer deposition (ALD) process.

A first gate insulating pattern 151 may be disposed on the first active pattern 141. The first gate insulating pattern 151 may overlap the first channel region 141C. However, in an embodiment, the first gate insulating pattern 151 does not overlap first source region 141S and the first drain region 141D. The first gate insulating pattern 151 may be formed along the profile of the first channel region 141C.

A second gate insulating pattern 152 may be disposed on the second active pattern 142. The second gate insulating pattern 152 may overlap the second channel region 142C. However, in an embodiment, the second gate insulating pattern 152 does not overlap second source region 142S and the second drain region 142D. The second gate insulating pattern 152 may be formed along the profile of the second channel region 142C. The first gate insulating pattern 151 and the second gate insulating pattern 152 may be formed of an inorganic insulating material such as silicon nitride, silicon oxide, or silicon oxynitride.

The first gate insulating pattern 151 and the second gate insulating pattern 152 may have a uniform thickness. In an embodiment, in order to form the first gate insulating pattern 151 and the second gate insulating pattern 152 with a uniform thickness, the first gate insulating pattern 151 and the second gate insulating pattern 152 may be formed through an atomic layer deposition (ALD) process.

A first gate electrode 161 may be disposed on the first gate insulating pattern 151. The first gate electrode 161 may overlap the first channel region 141C. The first gate electrode 161 may serve as a gate electrode of the first transistor TR1.

A second gate electrode 162 may be disposed on the second gate insulating pattern 152. The second gate electrode 162 may overlap the second channel region 142C. The second gate electrode 162 may serve as a gate electrode of the second transistor TR2. The first gate electrode 161 and the second gate electrode 162 may be formed of a conductive material such as molybdenum (Mo), copper (Cu), aluminum (Al), or titanium (Ti).

An interlayer insulating layer 170 may be disposed on the first gate electrode 161 and the second gate electrode 162. The interlayer insulating layer 170 may be disposed on the buffer layer 130 while covering the first gate electrode 161, the second gate electrode 162, the first active pattern 141, and the second active pattern 142. The interlayer insulating layer 170 may be formed of an inorganic insulating material such as silicon nitride, silicon oxide, or silicon oxynitride.

A first source electrode 181S, a first drain electrode 181D, a second source electrode 182S, and a second drain electrode 182D may be disposed on the interlayer insulating layer 170. The first source electrode 181S may be electrically connected to the first source region 141S, and the first drain electrode 181D may be electrically connected to the first drain region 141D. The second source electrode 182S may be electrically connected to the second source region 142S, and the second drain electrode 182D may be electrically connected to the second drain region 142D.

The first source electrode 181S may come into contact with the first source region 141S through a contact hole formed in the interlayer insulating layer 170, and the first drain electrode 181D may come into contact with the first drain region 141D through a contact hole formed in the interlayer insulating layer 170. The second source electrode 182S may come into contact with the second source region 142S through a contact hole formed in the interlayer insulating layer 170, and the second drain electrode 182D may come into contact with the second drain region 141D through a contact hole formed in the interlayer insulating layer 170. The first source electrode 181S, the first drain electrode 181D, the second source electrode 182S, and the second drain electrode 182D may be formed of a conductive material such as molybdenum (Mo), copper (Cu), aluminum (Al), or titanium (Ti).

In an embodiment, the lower conductive pattern 120 may be electrically connected to the second source electrode 182S. The second source electrode 182S may come into contact with the lower conductive pattern 120 through a contact hole formed in the interlayer insulating layer 170 and the buffer layer 130. In this case, an output saturation characteristic of the second transistor TR2 may be improved, and a driving range of the second transistor TR2 may increase.

The first active pattern 141, the first gate electrode 161, the first source electrode 181S, and the first drain electrode 181D may form the first transistor TR1. The first transistor TR1 may have a top gate structure in which the first gate electrode 161 is disposed on the first active pattern 141.

The second active pattern 142, the second gate electrode 162, the second source electrode 182S, and the second drain electrode 182D may form the second transistor TR2. The second transistor TR2 may have a top gate structure in which the second gate electrode 172 is disposed on the second active pattern 142.

Although not shown in FIG. 3, each of the first electrode and the second electrode of the capacitor CAP of FIG. 2 may be disposed on the same layer as one of the lower conductive pattern 120, the first active pattern 141, the first gate electrode 161, and the first source electrodes 181S. For example, the first electrode of the capacitor CAP may be disposed on the same layer as the first gate electrode 161, and the second electrode of the capacitor CAP may be disposed on the same layer as the first source electrode 181S.

A protective layer 190 may be disposed on the first source electrode 181S, the first drain electrode 181D, the second source electrode 182S, and the second drain electrode 182D. The protective layer 190 may be disposed on the interlayer insulating layer 170 while covering the first source electrode 181S, the first drain electrode 181D, the second source electrode 182S, and the second drain electrode 182D. The protective layer 190 may be formed of an inorganic insulating material such as silicon nitride, silicon oxide, or silicon oxynitride.

A planarization layer 200 may be disposed on the protective layer 190. The planarization layer 200 may provide a planar surface on the first transistor TR1 and the second transistor TR2. The planarization layer 200 may be formed of an organic insulating material such as polyimide (PI).

A first electrode 210 may be disposed on the planarization layer 200. The first electrode 210 may be electrically connected to the second source electrode 182S. The first electrode 210 may come into contact with the second source electrode 182S through a contact hole formed in the planarization layer 200 and the protective layer 190. The first electrode 210 may be formed of a conductive material such as a metal, an alloy, or a transparent conductive oxide. For example, the conductive material may include silver (Ag), indium tin oxide (ITO), or the like.

A pixel defining layer 220 may be disposed on the first electrode 210. The pixel defining layer 220 may be disposed on the planarization layer 200 while covering the first electrode 210. The pixel defining layer 220 may have a pixel opening for exposing at least a portion of the first electrode 210. In an embodiment, the pixel opening may expose a central portion of the first electrode 210, and the pixel defining layer 220 may cover a peripheral portion of the first electrode 210. The pixel defining layer 220 may be formed of an organic insulating material such as polyimide (PI).

A light emission layer 230 may be disposed on the first electrode 210. The light emission layer 230 may be disposed on the first electrode 210 exposed through the pixel opening. The light emission layer 230 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, and the like, and the high molecular organic compound may include poly(3,4-ethylenedioxythiophene), polyaniline, poly-phenylenevinylene, polyfluorene, and the like.

In an embodiment, the quantum dot may include a core including a group II-VI compound, a group III-V compound, a group IV-VI compound, a group IV element, a group IV compound, and a combination thereof. In an embodiment, the quantum dot may have a core-shell structure including a core and a shell surrounding the core. The shell may serve as a protective layer for maintaining semiconductor properties by preventing chemical modification of the core and a charging layer for imparting electrophoretic properties to the quantum dot.

A second electrode 240 may be disposed on the light emission layer 230. In an embodiment, the second electrode 240 may also be disposed on the pixel defining layer 220. The second electrode 240 may be formed of a conductive material such as a metal, an alloy, or a transparent conductive oxide. For example, the conductive material may include aluminum (Al), platinum (Pt), silver (Ag), magnesium (Mg), gold (Au), chromium (Cr), tungsten (W), titanium (Ti), etc. The first electrode 210, the light emission layer 230, and the second electrode 240 may form the light emitting element EL.

In the display device according to the present embodiment, the active patterns 141 and 142 may include channel regions 141C and 142C protruding downward along the profile of the trenches TCH1 and TCH2 of the barrier layer 110, so the active patterns 141 and 142 may include channel regions 141C and 142C having a relatively large length in a narrow area. Accordingly, high resolution of the display device may be realized, and electrical characteristics of the transistors TR1 and TR2 may be improved.

Figure 4:
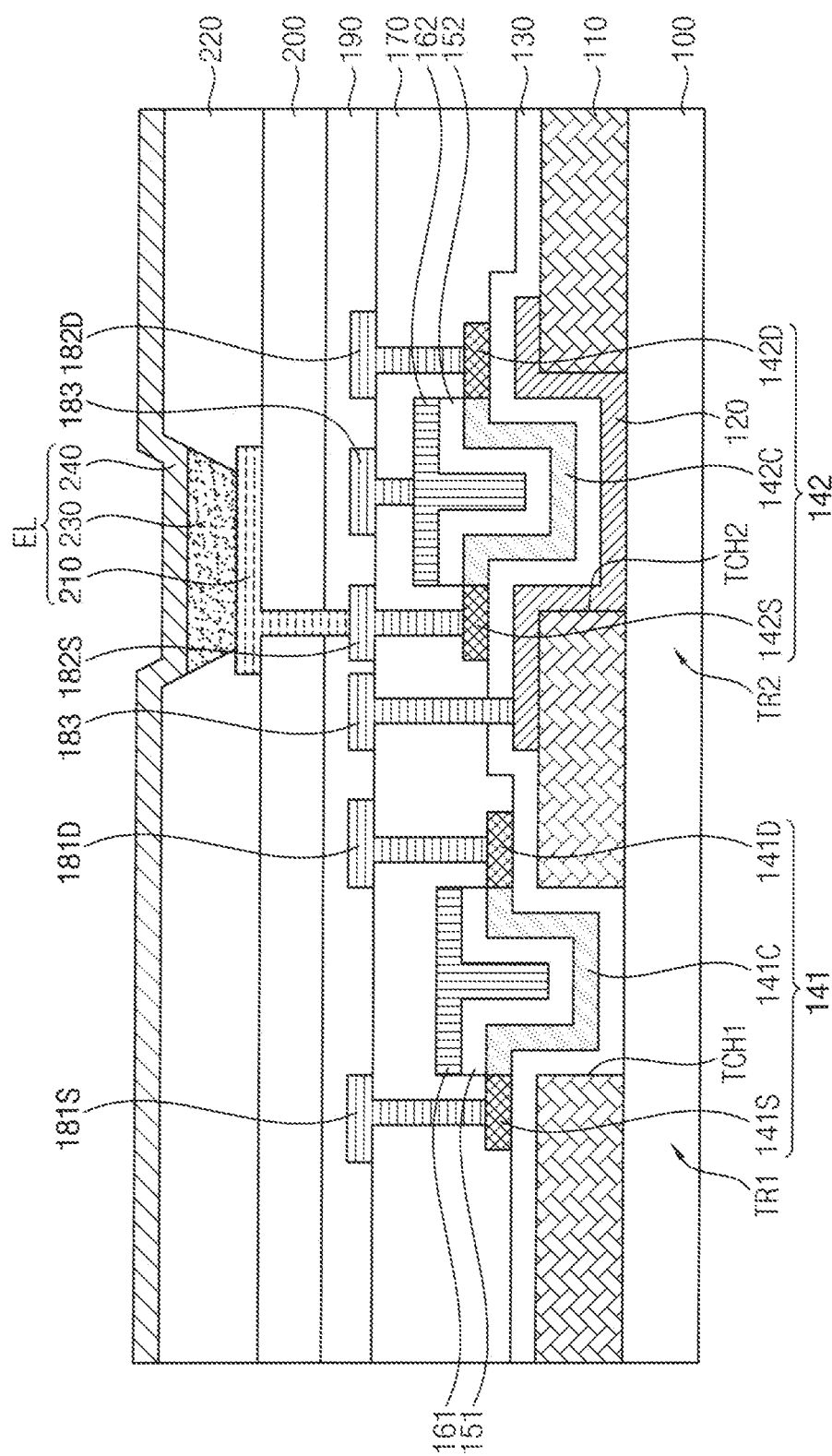
FIG. 4 is a sectional view illustrating a display device according to an embodiment of the present disclosure.

FIG. 4 is a sectional view illustrating a display device according to an embodiment of the present disclosure.

The display device described with reference to FIG. 4 may be substantially the same as or similar to the display device described with reference to FIGS. 1, 2, and 3 except for electrical connection of the lower conductive pattern. Accordingly, descriptions about redundant configurations will be omitted.

Referring to FIG. 4, in an embodiment, the lower conductive pattern 120 may be electrically connected to the second gate electrode 162. A connection electrode 183 which is separated from the second source electrode 182S may be disposed on the interlayer insulating layer 170, and the connection electrode 183 may electrically connect the lower conductive pattern 120 and the second gate electrode 162. The connection electrode 183 may come into contact with the second gate electrode 162 through a contact hole formed in the interlayer insulating layer 170 and the buffer layer 130. In this case, the second gate electrode 162 may serve as an upper gate electrode of the second transistor TR2, and the lower conductive pattern 120 may serve as a lower gate electrode of the second transistor TR2. Accordingly, the second transistor TR2 may have a dual gate structure, and the second transistor TR2 may have a relatively high charge mobility.

Figure 5:
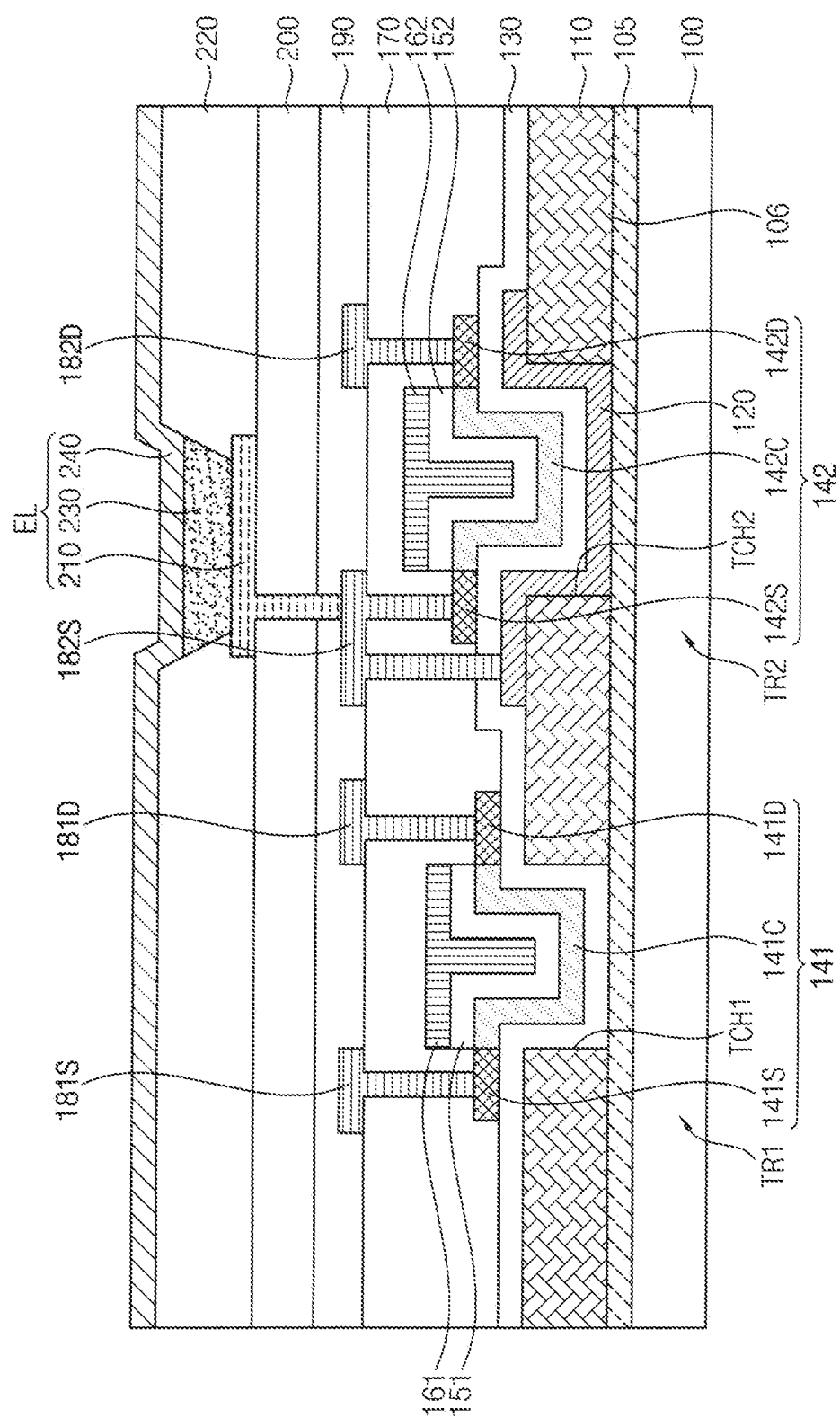
FIG. 5 is a sectional view illustrating a display device according to an embodiment of the present disclosure.

FIG. 5 is a sectional view illustrating a display device according to an embodiment of the present disclosure.

The display device described with reference to FIG. 5 may be substantially the same as or similar to the display device described with reference to FIGS. 1, 2, and 3 except that an etch stop layer is further included. Accordingly, descriptions about redundant configurations will be omitted.

Referring to FIG. 5, in an embodiment, an etch stop layer 105 may be disposed between the substrate 100 and the barrier layer 110. In an embodiment, each of the first trench TCH1 and the second trench TCH2 may be formed through the barrier layer 110 in the thickness direction to expose an upper surface 106 of the etch stop layer 105.

The etch stop layer 105 may have an etch rate smaller than that of the barrier layer 110. For example, when the first trench TCH1 and the second trench TCH2 are formed by etching the barrier layer 110 through a dry etching method using an etching gas, the etch rate for the etching gas of the etch stop layer 105 may be lower than the etch rate for the etching gas of the barrier layer 110. Accordingly, in the process of forming the first trench TCH1 and the second trench TCH2, only the barrier layer 110 may be etched and the etch stop layer 105 may not be etched. Thus, the first trench TCH1 and the second trench TCH2 may be have a uniform thickness (for example, substantially the same thickness).

In an embodiment, the etch stop layer 105 may include at least one of silicon nitride, silicon oxide, and silicon oxynitride. In another embodiment, the etch stop layer 105 may include at least one of indium (In), gallium (Ga), zinc (Zn), tin (Sn), hafnium (Hf), titanium (Ti), and zirconium (Zr).

Figure 6:
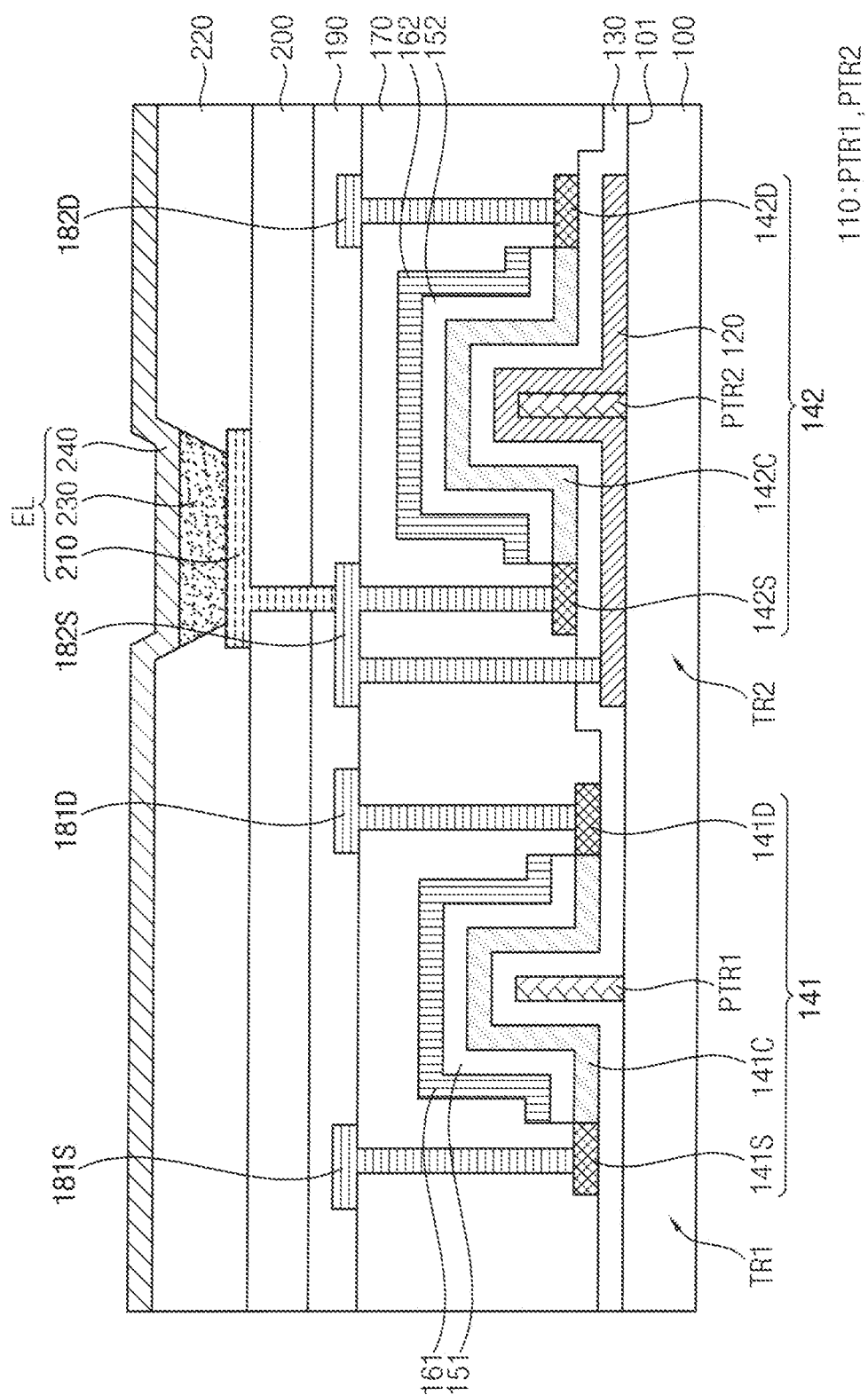
FIG. 6 is a sectional view illustrating a display device according to an embodiment of the present disclosure.

FIG. 6 is a sectional view illustrating a display device according to an embodiment of the present disclosure.

In the description for the display device with reference to FIG. 6, descriptions about components that are substantially the same as or similar to those of the display device described with reference to FIGS. 1, 2, and 3 will be omitted.

Referring to FIG. 6, the display device may include the first transistor TR1, the second transistor TR2, and the light emitting element EL disposed on the substrate 100.

The barrier layer 110 may be disposed on the substrate 100. The barrier layer 110 may be formed of an inorganic insulating material such as silicon nitride, silicon oxide, or silicon oxynitride.

The barrier layer 110 may include a first pattern PTR1 and a second pattern PTR2. The first pattern PTR1 and the second pattern PTR2 may be spaced apart from each other. Each of the first pattern PTR1 and the second pattern PTR2 may have a pillar shape. Each of the first pattern PTR1 and the second pattern PTR2 may have a shape extending upward from the upper surface 101 of the substrate 100.

The lower conductive pattern 120 may be disposed on the barrier layer 110. The lower conductive pattern 120 may be formed along the profile of the second pattern PTR2. The lower conductive pattern 120 may come into contact with the upper surface and sidewalls of the second pattern PTR2 and the upper surface 101 of the substrate 100. Accordingly, the lower conductive pattern 120 may protrude upward along the profile of the second pattern PTR2.

The lower conductive pattern 120 may have a uniform thickness. In an embodiment, the lower conductive pattern 120 may have a thickness of about 100 nm or less.

The buffer layer 130 may be disposed on the lower conductive pattern 120. The buffer layer 130 may be disposed on the substrate 100 while covering the first pattern PTR1 and the lower conductive pattern 120 of the second pattern PTR2.

The buffer layer 130 may be formed along the profile of the first pattern PTR1 and the profile of the lower conductive pattern 120 of the second pattern PTR2. The buffer layer 130 may come into contact with the upper surface 101 of the substrate 100, the upper surface and sidewalls of the first pattern PTR1, and the upper surface of the lower conductive pattern 120 of the second pattern PTR2. Since the lower conductive pattern 120 is formed along the profile of the second pattern PTR2, the buffer layer 130 may be formed along the profile of the second pattern PTR2.

The first active pattern 141 and the second active pattern 142 may be disposed on the buffer layer 130. The first active pattern 141 and the second active pattern 142 may be spaced apart from each other. The first active pattern 141 and the second active pattern 142 may be formed of an oxide semiconductor.

The first active pattern 141 may include the first channel region 141C overlapping the first pattern PTR1, and the first source region 141S and the first drain region 141D disposed at both ends of the first channel region 141C, respectively. The first channel region 141C may protrude upward along the profile of the first pattern PTR1. Since the first channel region 141C protrudes upward along the profile of the first pattern PTR1, the first transistor TR1 including the first channel region 141C having a relatively large length may be formed in a narrow area.

The second active pattern 142 may include the second channel region 142C overlapping the second pattern PTR2, and the second source region 142S and the second drain region 142D disposed at both ends of the second channel region 142C, respectively. The second channel region 142C may protrude upward along the profile of the second pattern PTR2. Since the second channel region 142C protrudes upward along the profile of the second pattern PTR2, the second transistor TR2 including the second channel region 142C having a relatively large length may be formed in a narrow area. The first active pattern 141 and the second active pattern 142 may have a uniform thickness.

The first gate insulating pattern 151 may be disposed on the first active pattern 141. The first gate insulating pattern 151 may overlap the first channel region 141C. The first gate insulating pattern 151 may be formed along the profile of the first channel region 141C.

The second gate insulating pattern 152 may be disposed on the second active pattern 142. The second gate insulating pattern 152 may overlap the second channel region 142C. The second gate insulating pattern 152 may be formed along the profile of the second channel region 142C. The first gate insulating pattern 151 and the second gate insulating pattern 152 may have a uniform thickness.

The first gate electrode 161 may be disposed on the first gate insulating pattern 151. The first gate electrode 161 may overlap the first channel region 141C. The second gate electrode 162 may be disposed on the second gate insulating pattern 152. The second gate electrode 162 may overlap the second channel region 142C.

The interlayer insulating layer 170 may be disposed on the first gate electrode 161 and the second gate electrode 162. The interlayer insulating layer 170 may be disposed on the buffer layer 130 while covering the first gate electrode 161, the second gate electrode 162, the first active pattern 141, and the second active pattern 142.

The first source electrode 181S, the first drain electrode 181D, the second source electrode 182S, and the second drain electrode 182D may be disposed on the interlayer insulating layer 170. The first source electrode 181S may be electrically connected to the first source region 141S, and the first drain electrode 181D may be electrically connected to the first drain region 141D. The second source electrode 182S may be electrically connected to the second source region 142S, and the second drain electrode 182D may be electrically connected to the second drain region 142D.

In an embodiment, the lower conductive pattern 120 may be electrically connected to the second source electrode 182S. In this case, an output saturation characteristic of the second transistor TR2 may be improved, and a driving range of the second transistor TR2 may increase.

The first active pattern 141, the first gate electrode 161, the first source electrode 181S, and the first drain electrode 181D may form the first transistor TR1. The first transistor TR1 may have a top gate structure in which the first gate electrode 161 is disposed on the first active pattern 141.

The second active pattern 142, the second gate electrode 162, the second source electrode 182S, and the second drain electrode 182D may form the second transistor TR2. The second transistor TR2 may have a top gate structure in which the second gate electrode 172 is disposed on the second active pattern 132.

The protective layer 190 may be disposed on the first source electrode 181S, the first drain electrode 181D, the second source electrode 182S, and the second drain electrode 182D. The protective layer 190 may be disposed on the interlayer insulating layer 170 while covering the first source electrode 181S, the first drain electrode 181D, the second source electrode 182S, and the second drain electrode 182D. The planarization layer 200 may be disposed on the protective layer 190.

The first electrode 210 may be disposed on the planarization layer 200. The first electrode 210 may be electrically connected to the second source electrode 182S.

The pixel defining layer 220 may be disposed on the first electrode 210. The pixel defining layer 220 may be disposed on the planarization layer 200 while covering the first electrode 210. The pixel defining layer 220 may have a pixel opening for exposing at least a portion of the first electrode 210.

The light emission layer 230 may be disposed on the first electrode 210. The light emission layer 230 may be disposed on the first electrode 210 exposed through the pixel opening.

The second electrode 240 may be disposed on the light emission layer 230. The first electrode 210, the light emission layer 230, and the second electrode 240 may form the light emitting element EL.

In the display device according to the present embodiment, the active patterns 141 and 142 include the channel regions 141C and 142C protruding upward along the profile of the pillar-shape patterns PTR1 and PTR2 of the barrier layer 110 so that the active patterns 141 and 142 may include the channel regions 141C and 142C having a relatively large length in a narrow area. Accordingly, high resolution of the display device may be achieved, and electrical characteristics of the transistors TR1 and TR2 may be improved.

Figure 7:
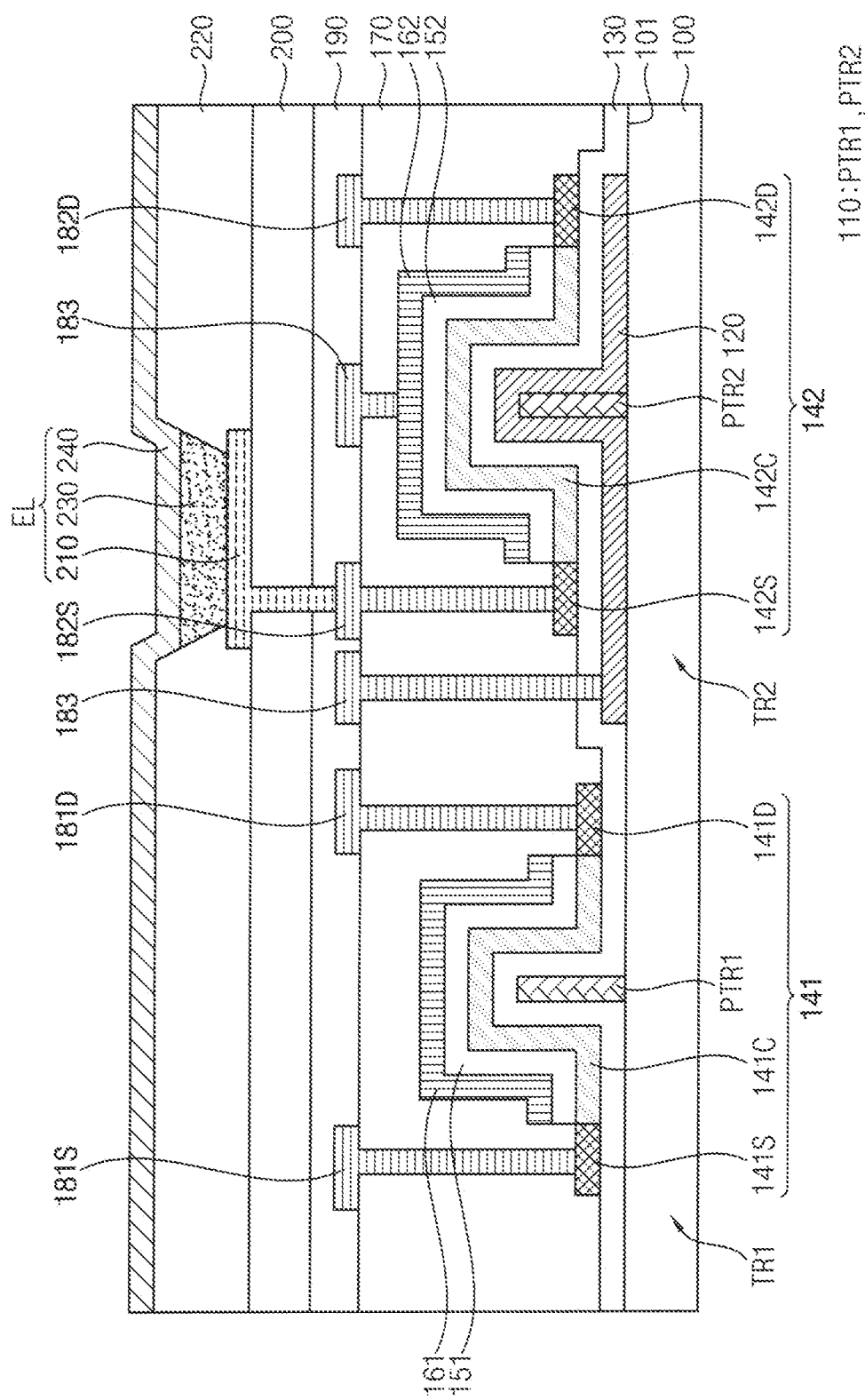
FIG. 7 is a sectional view illustrating a display device according to an embodiment of the present disclosure.

FIG. 7 is a sectional view illustrating a display device according to an embodiment of the present disclosure.

The display device described with reference to FIG. 7 may be substantially the same as or similar to the display device described with reference to FIG. 6 except for an electrical connection of the lower conductive pattern. Accordingly, descriptions about redundant configurations will be omitted.

Referring to FIG. 7, according to an embodiment, the lower conductive pattern 120 may be electrically connected to the second gate electrode 162. The connection electrode 183 which is separated from the second source electrode 182S may be disposed on the interlayer insulating layer 170, and the connection electrode 183 may electrically connect the lower conductive pattern 120 and the second gate electrode 162. The connection electrode 183 may come into contact with the second gate electrode 162 through a contact hole formed in the interlayer insulating layer 170 and come into contact with the lower conductive pattern 120 through a contact hole formed in the interlayer insulating layer 170 and the buffer layer 130. In this case, the second gate electrode 162 may serve as the upper gate electrode of the second transistor TR2, and the lower conductive pattern 120 may serve as the lower gate electrode of the second transistor TR2. Accordingly, the second transistor TR2 may have a dual gate structure, and the second transistor TR2 may have a relatively high charge mobility.

Figure 8:
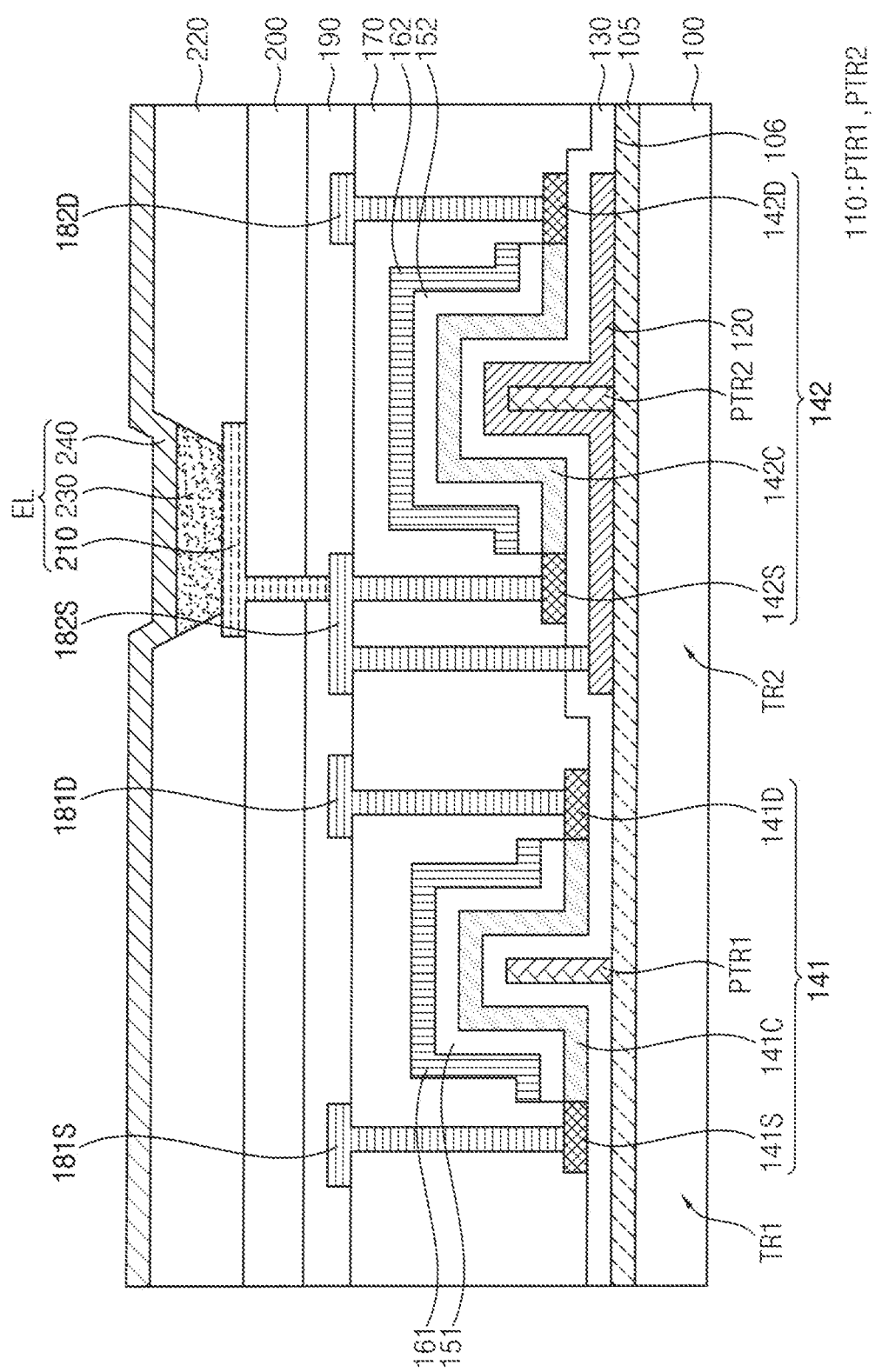
FIG. 8 is a sectional view illustrating a display device according to an embodiment of the present disclosure.

FIG. 8 is a sectional view illustrating a display device according to an embodiment of the present disclosure.

The display device described with reference to FIG. 8 may be substantially the same as or similar to the display device described with reference to FIG. 6 except that an etch stop layer is further included. Accordingly, descriptions about redundant configurations will be omitted.

Referring to FIG. 8, according to an embodiment, the etch stop layer 105 may be disposed between the substrate 100 and the barrier layer 110. The first pattern PTR1 and the second pattern PTR2 may be disposed on the upper surface 106 of the etch stop layer 105.

The etch stop layer 105 may have an etch rate lower than that of the barrier layer 110. For example, when the first pattern PTR1 and the second pattern PTR2 are formed by etching the barrier layer 110 through a dry etching method using an etching gas, the etch rate for the etching gas of the etch stop layer 105 may be lower than the etch rate for the etching gas of the barrier layer 110. Accordingly, in the process of forming the first pattern PTR1 and the second pattern PTR2, only the barrier layer 110 may be etched, and the etch stop layer 105 may not be etched. Thus, all remaining portions of the barrier layer 110 except for the first pattern PTR1 and the second pattern PTR2 may be removed.

In an embodiment, the etch stop layer 105 may include at least one of silicon nitride, silicon oxide, and silicon oxynitride. In another embodiment, the etch stop layer 105 may include at least one of indium (In), gallium (Ga), zinc (Zn), tin (Sn), hafnium (Hf), titanium (Ti), and zirconium (Zr).

The display device according to the embodiments may be applied to a display device included in a computer, a notebook, a mobile phone, a smartphone, a smart pad, a PMP, a PDA, an MP3 player, or the like.

Although the display devices according to the embodiments have been described with reference to the drawings, the illustrated embodiments are examples, and may be modified and changed by a person having ordinary knowledge in the relevant technical field without departing from the technical spirit described in the following claims.

What is claimed is:

1. A display device comprising:
   a substrate;
   a barrier layer disposed on the substrate and having a plurality of trenches;
   an etch stop layer disposed between the substrate and the barrier layer and in contact with the substrate and the barrier layer, and having an etch rate lower than an etch rate of the barrier layer;
   an active pattern disposed on the barrier layer, formed of an oxide semiconductor, and including a channel region protruding downward along a profile of the trench, and a source region and a drain region disposed at each end of the channel region, respectively;
   a gate electrode disposed on the active pattern and overlapping the channel region, and including a protruding portion extending downward along the profile of the trench and an upper surface being an opposite surface to the protruding portion;
   a source electrode electrically connected to the source region through a first contact hole;
   a drain electrode electrically connected to the drain region through a second contact hole;
   a lower conductive pattern disposed between the barrier layer and a buffer layer, and directly connected to the source electrode; and
   a first electrode disposed on the source electrode and the drain electrode, and in contact with a light emission layer,
   wherein the source region and the drain region of the active pattern are doped with P-type or N-type impurity, and the channel region of the active pattern is doped with an opposite type of impurity than the source region and the drain region of the active pattern,
   wherein the source electrode is connected to the first electrode through a third contact hole, and
   wherein the source electrode includes a first portion disposed on the upper surface of the gate electrode which is the opposite surface to the protruding portion of the gate electrode.

2. The display device of claim 1, wherein the buffer layer is disposed between the barrier layer and the active pattern and formed along the profile of the trench, and an interlayer insulating layer disposed on the gate electrode, and
   wherein the source electrode and the drain electrode are disposed on the interlayer insulating layer.

3. The display device of claim 1, wherein the lower conductive pattern is formed along the profile of the trench and has a uniform thickness.

4. The display device of claim 3, wherein the lower conductive pattern is connected to the source electrode through a fourth contact hole.

5. The display device of claim 3, wherein the lower conductive pattern has a thickness of 100 nm or less.

6. The display device of claim 1, wherein the etch stop layer includes at least one of silicon nitride, silicon oxide, and silicon oxynitride.

7. The display device of claim 1, wherein the etch stop layer includes at least one of indium (In), gallium (Ga), zinc (Zn), tin (Sn), hafnium (Hf), titanium (Ti), and zirconium (Zr).

8. The display device of claim 1, further comprising a gate insulating pattern disposed between the active pattern and the gate electrode, overlapping the channel region, and formed along a profile of the channel region.

9. The display device of claim 1, wherein the barrier layer includes at least one of silicon nitride, silicon oxide, and silicon oxynitride.

\* \* \* \* \*